United States Patent
Woo et al.

(10) Patent No.: US 12,158,699 B2
(45) Date of Patent: *Dec. 3, 2024

(54) SEMICONDUCTOR PHOTORESIST COMPOSITION AND METHOD OF FORMING PATTERNS USING THE COMPOSITION

(71) Applicant: Samsung SDI Co., Ltd., Yongin-si (KR)

(72) Inventors: Changsoo Woo, Suwon-si (KR); Eunmi Kang, Suwon-si (KR); Jaehyun Kim, Suwon-si (KR); Jimin Kim, Suwon-si (KR); Taeho Kim, Suwon-si (KR); Ran Namgung, Suwon-si (KR); Kyungsoo Moon, Suwon-si (KR); Hwansung Cheon, Suwon-si (KR); Seungyong Chae, Suwon-si (KR); Seung Han, Suwon-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 717 days.

This patent is subject to a terminal disclaimer.

(21) Appl. No.: 17/217,941

(22) Filed: Mar. 30, 2021

(65) Prior Publication Data
US 2021/0311387 A1 Oct. 7, 2021

(30) Foreign Application Priority Data

Apr. 2, 2020 (KR) .................. 10-2020-0040507

(51) Int. Cl.
*G03F 7/004* (2006.01)
*C07F 7/22* (2006.01)
(Continued)

(52) U.S. Cl.
CPC .......... *G03F 7/0042* (2013.01); *C07F 7/2224* (2013.01); *G03F 7/0045* (2013.01); *H01L 21/0274* (2013.01)

(58) Field of Classification Search
None
See application file for complete search history.

(56) References Cited

U.S. PATENT DOCUMENTS 2,826,597 A 3/1958 Gloskey
2,832,751 A 4/1958 Weinberg et al.
(Continued)

FOREIGN PATENT DOCUMENTS

CN 102269929 A 12/2011
CN 108351594 A 7/2018
(Continued)

OTHER PUBLICATIONS

US Notice of Allowance dated Jul. 29, 2022, issued in U.S. Appl. No. 16/859,682 (7 pages).
(Continued)

*Primary Examiner* — Martin J Angebranndt
(74) *Attorney, Agent, or Firm* — Lewis Roca Rothgerber Christie LLP

(57) ABSTRACT

A semiconductor photoresist composition includes an organometallic compound represented by Chemical Formula 1, a photoacid generator (PAG), and a solvent:

Chemical Formula 1

(Continued)

In Chemical Formula 1, R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof; and X, Y, and Z are each independently $-OR^1$ or $-OC(=O)R^2$.

13 Claims, 3 Drawing Sheets

(51) Int. Cl.
 *G03F 7/20* (2006.01)
 *H01L 21/027* (2006.01)

(56) References Cited

U.S. PATENT DOCUMENTS

| | | | |
|---|---|---|---|
| 5,061,599 | A | 10/1991 | Kudo et al. |
| 6,103,448 | A | 8/2000 | Kim et al. |
| 6,514,666 | B1 | 2/2003 | Choi et al. |
| 6,607,867 | B1 | 8/2003 | Kim et al. |
| 11,092,890 | B2 * | 8/2021 | Moon .................. H01L 21/475 |
| 11,609,494 | B2 * | 3/2023 | Kim .................. H01L 21/3081 |
| 2002/0072009 | A1 | 6/2002 | Kim et al. |
| 2011/0045406 | A1 | 2/2011 | Keszler et al. |
| 2011/0293888 | A1 | 12/2011 | Stowers et al. |
| 2012/0208127 | A1 | 8/2012 | Hatakeyama |
| 2013/0005150 | A1 | 1/2013 | Ogihara et al. |
| 2013/0224652 | A1 | 8/2013 | Bass et al. |
| 2016/0116839 | A1 | 4/2016 | Meyers et al. |
| 2016/0310944 | A1 | 10/2016 | Nishimura et al. |
| 2017/0052449 | A1 | 2/2017 | Nakagawa et al. |
| 2017/0102612 | A1 | 4/2017 | Meyers et al. |
| 2018/0046086 | A1 | 2/2018 | Wallner et al. |
| 2019/0033713 | A1 | 1/2019 | Kasahara et al. |
| 2019/0227432 | A1 | 7/2019 | Shiratani |
| 2019/0243243 | A1 | 8/2019 | Naito et al. |
| 2019/0337969 | A1 | 11/2019 | Odedra et al. |
| 2019/0384171 | A1 | 12/2019 | Zi et al. |
| 2020/0041896 | A1 * | 2/2020 | Moon .................. G03F 7/2004 |
| 2020/0041901 | A1 | 2/2020 | Namgung et al. |
| 2020/0073238 | A1 | 3/2020 | Zi et al. |
| 2020/0117085 | A1 | 4/2020 | Moon et al. |
| 2020/0124970 | A1 * | 4/2020 | Kocsis .................. G03F 7/325 |
| 2021/0311387 | A1 | 10/2021 | Woo et al. |
| 2021/0356861 | A1 * | 11/2021 | Han .................. C07F 7/2224 |
| 2024/0027899 | A1 * | 1/2024 | Han .................. G03F 7/11 |

FOREIGN PATENT DOCUMENTS

| | | | | |
|---|---|---|---|---|
| CN | 110780536 | A | 2/2020 | |
| CN | 111856879 | A | 10/2020 | |
| JP | H8-260159 | A | 10/1996 | |
| JP | 3990146 | B2 | 10/2007 | |
| JP | 2009134088 | A * | 6/2009 | |
| JP | 2009-229593 | A | 10/2009 | |
| JP | 4831324 | B2 | 12/2011 | |
| JP | 5178858 | B2 | 4/2013 | |
| JP | 5650086 | B2 | 1/2015 | |
| JP | 5708521 | B2 | 4/2015 | |
| JP | 2017-207532 | A | 11/2017 | |
| JP | 2018-502173 | A | 1/2018 | |
| JP | 2018-017780 | A | 2/2018 | |
| JP | 2018-041099 | A | 3/2018 | |
| JP | 2018116160 | A * | 7/2018 | |
| JP | 2019-500490 | A | 1/2019 | |
| JP | 2019-183150 | A | 10/2019 | |
| JP | 2020021071 | A * | 2/2020 | ............ C07F 7/2224 |
| JP | 2020-184074 | A | 11/2020 | |
| KR | 1995-0001702 | B1 | 2/1995 | |
| KR | 10-0269513 | B1 | 10/2000 | |
| KR | 2002-0041759 | A | 6/2002 | |
| KR | 10-0398312 | B1 | 9/2003 | |
| KR | 10-0386719 | B1 | 5/2004 | |
| KR | 10-2014-0121826 | A | 10/2014 | |
| KR | 10-1486533 | B1 | 2/2015 | |
| KR | 10-2017-0022945 | A | 3/2017 | |
| KR | 10-2017-0132726 | A | 12/2017 | |
| KR | 10-2018-0043170 | A | 4/2018 | |
| KR | 10-2019-0045162 | A | 5/2019 | |
| KR | 10-2019-0082279 | A | 7/2019 | |
| KR | 10-2020-0005370 | A | 1/2020 | |
| KR | 10-2020-0014043 | A | 2/2020 | |
| KR | 10-2020-0014185 | A | 2/2020 | |
| KR | 10-2020-0014216 | A | 2/2020 | |
| KR | 10-2020-0018080 | A | 2/2020 | |
| TW | 201920214 | A | 6/2019 | |
| TW | 201924927 | A | 7/2019 | |
| TW | I669353 | B | 8/2019 | |
| TW | 202007691 | A | 2/2020 | |
| TW | I684063 | B | 2/2020 | |
| TW | I684068 | B | 2/2020 | |
| WO | WO 2016/140057 | A1 | 9/2016 | |
| WO | WO 2017-169440 | A1 | 10/2017 | |
| WO | WO-2017204090 | A1 * | 11/2017 | ............ C01G 19/02 |
| WO | WO 2018/043506 | A1 | 3/2018 | |
| WO | WO 2018/046438 | A1 | 3/2018 | |
| WO | WO 2018/168221 | A1 | 9/2018 | |
| WO | WO 2018-179704 | A1 | 10/2018 | |

OTHER PUBLICATIONS

US Notice of Allowance dated Nov. 9, 2022, issued in U.S. Appl. No. 16/859,682 (7 pages).
Anderson, Christopher N., et al.; "The Sematech Berkeley MET: extending EUV learning down to 16nm half pitch"; Proc. of SPIE; vol. 7969, 79690R (2011); (7 pages).
Japanese Office Action for JP Application No. 2021-056503 dated Mar. 29, 2022, 3 pages.
Taiwanese Office Action for TW Application No. 110111615 dated Apr. 29, 2022, 5 pages.
Notice of Allowance dated Apr. 13, 2022 in U.S. Appl. No. 16/859,682, 8 pages.
Taiwanese Search Report dated Jun. 25, 2022, for Application No. 110143319, 2 pages.
Japanese Notice of Reasons for Rejection dated Nov. 15, 2022 issued in JP Application No. 2021-183873 (3 pages).
US Office Action dated Mar. 24, 2023, issued in U.S. Appl. No. 17/454,453 (17 pages).
US Office Action dated May 10, 2023, issued in U.S. Appl. No. 17/306,820 (8 pages).
Notice of Reason for Rejection for JP Application No. 2021-078454 dated Jun. 7, 2022, 3 pages.
Okamoto, Hiroshi et al., "Peroxypolytungstic acids: A new inorganic resist material", Applied Physics Letters, Aug. 4, 1986, 49 (5), pp. 298-300.
Stowers, Jason K. et al., "Directly patterned inorganic hardmask for EUV lithography,", Proc. of SPIE, vol. 7969, Extreme Ultraviolet (EUV) Lithography II, 796915, 2011, 11pp.
JPO Office action dated May 18, 2021 issued in corresponding JP Application No. 2020-080534, 4 pages.
Non-Final Rejection issued in related U.S. Appl. No. 16/859,682, dated Dec. 20, 2021, 12 pages.
Taiwanese Office Action dated Nov. 8, 2021, in Taiwanese Patent Application No. 109114182 and accompanying Search Report (6 pages).
TW Office Action and Search Report dated Nov. 16, 2021 in corresponding Taiwanese Patent Application No. 110116951, 7 pages.
US Restriction Requirement dated Jan. 3, 2023, issued in U.S. Appl. No. 17/306,820 (6 pages).
Korean Office Action dated May 12, 2023, issued in Korean Patent Application No. 10-2020-0040507 (7 pages).
Korean Office Action dated May 12, 2023, issued in Korean Patent Application No. 10-2020-0056720 (7 pages).

(56) References Cited

OTHER PUBLICATIONS

Chinese Office Action (including a search report) dated Mar. 29, 2024, of the corresponding Chinese Patent Application No. 202110349838.1 (7 pages).

* cited by examiner

SEMICONDUCTOR PHOTORESIST COMPOSITION AND METHOD OF FORMING PATTERNS USING THE COMPOSITION

CROSS-REFERENCE TO RELATED APPLICATION

This application claims priority to and the benefit of Korean Patent Application No. 10-2020-0040507, filed in the Korean Intellectual Property Office on Apr. 2, 2020, the entire content of which is incorporated herein by reference.

BACKGROUND

1. Field

One or more embodiments of this disclosure relate to semiconductor photoresist composition and a method of forming patterns using the same.

2. Description of the Related Art

EUV (extreme ultraviolet) lithography has garnered attention as a (e.g., suitable, important, and/or essential) technology for manufacturing a next generation semiconductor device. The EUV lithography is a pattern-forming technology utilizing an EUV ray having a wavelength of about 13.5 nm as an exposure light source. By utilizing the EUV lithography, an extremely fine pattern (e.g., less than or equal to about 20 nm in width) may be formed in an exposure process during a manufacture of a semiconductor device.

The extreme ultraviolet (EUV) lithography is realized through development of compatible photoresists which can perform at a spatial resolution of less than or equal to about 16 nm. Currently, efforts to satisfy (e.g., mitigate) insufficient specifications (e.g., shortcomings) of traditional chemically amplified (CA) photoresists (e.g., shortcomings in resolution, photospeed, and/or feature roughness (also referred to as line edge roughness or LER)) for the next generation device are being made.

An intrinsic image blurring due to an acid catalyzed reaction in polymer-type (e.g., polymer-containing) photoresists may limit a resolution in small feature sizes, which is well known in electron beam (e-beam) lithography. The chemically amplified (CA) photoresists are designed for high sensitivity, but because their elemental makeups may reduce light absorbance of the photoresists at a wavelength of about 13.5 nm and thus decrease their sensitivity, some chemically amplified (CA) photoresists may have more difficulties under an EUV exposure.

In addition, the CA photoresists may have difficulties in the small feature sizes due to roughness issues, and line edge roughness (LER) of the CA photoresists may be increased, as a photospeed is decreased partially due to an essence of acid catalyst processes. Accordingly, a novel high performance photoresist is desired (or required) in a semiconductor industry because of these defects and problems of the CA photoresists.

Inorganic photoresists based on peroxo-polyacids of tungsten mixed with tungsten, niobium, titanium, and/or tantalum have been reported as radiation sensitive materials for patterning.

These materials may be effective (or suitable) for patterning large pitches for bilayer configuration as far-ultraviolet (deep UV), X-ray, and electron beam sources. More recently, when cationic hafnium metal oxide sulfate (HfSOx) materials, along with a peroxo complexing agent, have been utilized to image a 15 nm half-pitch (HP) through projection EUV exposure, improved performance has been obtained. This system exhibits high performance of a non-CA photoresist and has a practicable photospeed close to a requirement for an EUV photoresist. However, the hafnium metal oxide sulfate materials having the peroxo complexing agent have a few practical drawbacks. First, these materials are coated in a mixture of corrosive sulfuric acid/hydrogen peroxide and have insufficient shelf-life stability. Second, a structural change thereof for performance improvement as a composite mixture is not easy. Third, development should be performed in a TMAH (tetramethylammonium hydroxide) solution at an extremely high concentration of about 25 wt % and the like.

In an effort to overcome the aforementioned drawbacks of the chemically amplified (CA) organic photosensitive composition, an inorganic photosensitive composition has been researched. The inorganic photosensitive composition is mainly utilized for negative tone patterning having resistance against removal by a developing composition due to chemical modification through nonchemical amplification mechanism. The inorganic composition contains an inorganic element having a higher EUV absorption rate than hydrocarbon compounds, and thus may secure sensitivity through the nonchemical amplification mechanism and in addition, is less sensitive about a stochastic effect and thus known to have low line edge roughness and the small number of defects.

In recent years, active research has been conducted as it is known that molecules containing tin have excellent (or suitable) absorption of extreme ultraviolet rays. As for an organic tin polymer among them, an alkyl ligand is dissociated by light absorption or secondary electrons produced thereby and cross-linked with adjacent chains through an oxo bond, and thus enables the negative tone patterning which may not be removed by an organic developing solution. This organic tin polymer exhibits greatly improved sensitivity as well as maintains a resolution and line edge roughness, but the patterning characteristics need to be additionally improved for commercial availability.

SUMMARY

One or more aspects of one or more embodiments of the present disclosure are directed toward a semiconductor photoresist composition having improved etch resistance, sensitivity, resolution, pattern-forming capability, etc.

One or more embodiments are directed toward a method of forming patterns utilizing the semiconductor photoresist composition.

A semiconductor photoresist composition according to one or more embodiments may include an organometallic compound represented by Chemical Formula 1, a photoacid generator (PAG), and a solvent.

Chemical Formula 1

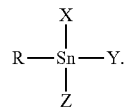

In Chemical Formula 1,

R may be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof, X, Y, and Z may each independently be —OR$^1$ or —OC(=O)R$^2$, R$^1$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and R$^2$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The photoacid generator (PAG) may include a cationic compound represented by Chemical Formula 2, Chemical Formula 3, or Chemical Formula 4.

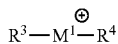

Chemical Formula 2

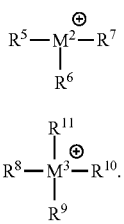

Chemical Formula 3

Chemical Formula 4

In Chemical Formula 2 to Chemical Formula 4,

M$^1$ may be F, Cl, Br, or I,

M$^2$ may be O, S, Se, or Te,

M$^3$ may be N, P, As, or Sb, and

R$^3$ to R$^{11}$ may each independently be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, or a combination thereof.

The photoacid generator (PAG) may include a cationic compound represented by Chemical Formula 5 or Chemical Formula 6.

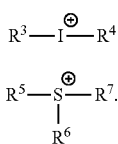

Chemical Formula 5

Chemical Formula 6

In Chemical Formula 5 and Chemical Formula 6,

R$^3$ to R$^7$ may each independently be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, or a combination thereof.

The organometallic compound represented by Chemical Formula 1 and the photoacid generator (PAG) may be included in a weight ratio of about 99:1 to about 60:40.

The organometallic compound represented by Chemical Formula 1 and the photoacid generator (PAG) may be included in a weight ratio of about 95:5 to about 85:15.

The semiconductor photoresist composition may further include an organometallic compound represented by Chemical Formula 7, an organometallic compound represented by Chemical Formula 8, or a combination thereof.

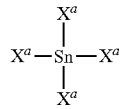

Chemical Formula 7

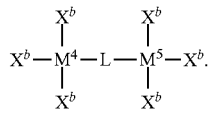

Chemical Formula 8

In Chemical Formula 7 and Chemical Formula 8,

X$^a$ and X$^b$ may each independently be —OR$^{12}$ or —OC(=O)R$^3$,

R$^{12}$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, R$^{13}$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, M$^4$ and M$^5$ may each independently be selected from the group consisting of tin (Sn), indium (In), and antimony (Sb), L may be a single bond, a substituted or unsubstituted divalent C1 to C20 saturated aliphatic hydrocarbon group, a substituted or unsubstituted divalent C3 to C20 saturated or unsaturated alicyclic hydrocarbon group, a substituted or unsubstituted divalent C2 to C20 unsaturated aliphatic hydrocarbon group including at least one double bond or triple bond, a substituted or unsubstituted divalent C6 to C20 aromatic hydrocarbon group, —O—, —C(=O)—, or a combination thereof.

A weight ratio of the organometallic compound represented by Chemical Formula 7, the organometallic compound represented by Chemical Formula 8, or the sum (e.g., mixture) of the organometallic compound represented by Chemical Formula 7 and the organometallic compound represented by Chemical Formula 8 to the organometallic compound represented by Chemical Formula 1 may be about 1:1 to about 1:20.

R may be a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethoxy group, a propoxy group, or a combination thereof, $R^1$ may be a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, and $R^2$ may be hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof.

R may be a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, a propoxy group, or a combination thereof, $R^1$ may be a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof, and $R^2$ may be hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

The compound represented by Chemical Formula 1 may include a compound represented by Chemical Formula 9, a compound represented by Chemical Formula 10, a compound represented by Chemical Formula 11, a compound represented by Chemical Formula 12, or a combination thereof.

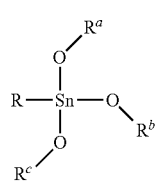

Chemical Formula 9

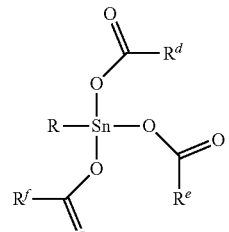

Chemical Formula 10

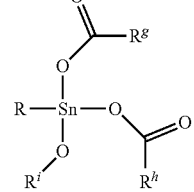

Chemical Formula 11

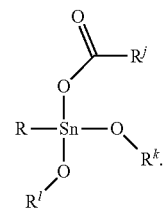

Chemical Formula 12

In Chemical Formula 9, Chemical Formula 10, Chemical Formula 11, and Chemical Formula 12, $R^a$, $R^b$, $R^c$, $R^i$, $R^k$, and $R^l$ may each independently be the same as the definition for $R^1$, and $R^d$, $R^e$, $R^f$, $R^g$, $R^h$, and $R^j$ may each independently be the same as the definition for $R^2$.

The semiconductor photoresist composition may further include an additive of a surfactant, a cross-linking agent, a leveling agent, an organic acid, a quencher, or a combination thereof.

The method of forming patterns according to one or more embodiments may include forming an etching-objective layer on a substrate, coating the semiconductor photoresist composition on the etching-objective layer to form a photoresist layer, patterning the photoresist layer to form a photoresist pattern, and etching the etching-objective layer utilizing the photoresist pattern as an etching mask.

The photoresist pattern may be formed utilizing light in a wavelength of about 5 nm to about 150 nm.

The method of forming patterns may further include providing a resist underlayer formed between the substrate and the photoresist layer.

The photoresist pattern may have a width of about 5 nm to about 100 nm.

The semiconductor photoresist composition according to one or more embodiments has relatively improved etch resistance, sensitivity, resolution, and pattern-forming capability and thus may provide a photoresist pattern having improved sensitivity and a high aspect ratio without a pattern collapse.

DETAILED DESCRIPTION

Figure 1:
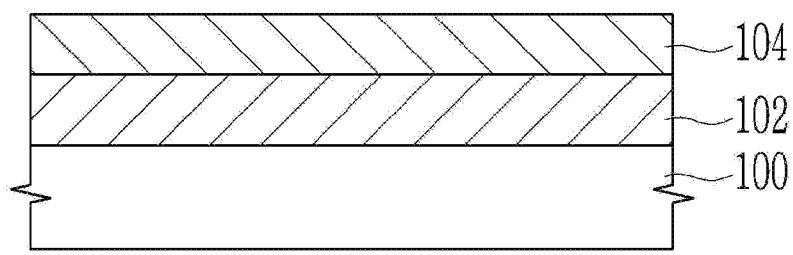
FIGS. 1-5 are cross-sectional views for explaining a method of forming patterns utilizing a semiconductor photoresist composition according to one or more embodiments.

Hereinafter, the embodiments of the present disclosure will be described in more detail, referring to the accompanying drawings. However, in the description of the present disclosure, descriptions for already known functions or components will not be providing, for clarity of the present disclosure.

In order to clearly describe the present disclosure, parts which are not related to the description are not provided, and the same reference numeral refers to the same or like components, throughout the specification. In addition, because the size and the thickness of each component shown in the drawing are optionally represented for convenience of the description, the present disclosure is not limited to the illustration.

In the drawings, the thickness of layers, films, panels, regions, etc., are exaggerated for clarity. In the drawings, the thickness of one or more parts of layers and/or regions, etc., is exaggerated for clarity. It will be understood that when an element such as a layer, film, region, or substrate is referred to as being "on" another element, it can be directly on the other element (without any intervening elements therebetween) or one or more intervening elements may also be present.

As used herein, "substituted" refers to replacement of a hydrogen atom by deuterium, a halogen, a hydroxy group, a cyano group, a nitro group, —NRR' (wherein, R and R' are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), —SiRR'R" (wherein, R, R', and R" are each independently hydrogen, a substituted or unsubstituted C1 to C30 saturated or unsaturated aliphatic hydrocarbon group, a substituted or unsubstituted C3 to C30 saturated or unsaturated alicyclic hydrocarbon group, or a substituted or unsubstituted C6 to C30 aromatic hydrocarbon group), a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, or a combination thereof. "Unsubstituted" refers to non-replacement of a hydrogen atom by another substituent and remaining of the hydrogen atom.

As used herein, when a definition is not otherwise provided, "alkyl group" refers to a linear or branched aliphatic hydrocarbon group. The alkyl group may be "a saturated alkyl group" without any double bond or triple bond.

The alkyl group may be a C1 to C8 alkyl group. For example, the alkyl group may be a C1 to C7 alkyl group, a C1 to C6 alkyl group, or a C1 to C5 alkyl group. For example, the alkyl group (e.g., C1 to C5 alkyl group) may be a methyl group, an ethyl group, a propyl group, an isopropyl group, an n-butyl group, an isobutyl group, a sec-butyl group, a tert-butyl group, or a 2,2-dimethylpropyl group.

As used herein, when a definition is not otherwise provided, "cycloalkyl group" refers to a monovalent cyclic aliphatic hydrocarbon group.

The cycloalkyl group may be a C3 to C8 cycloalkyl group, for example, a C3 to C7 cycloalkyl group, a C3 to C6 cycloalkyl group, a C3 to C5 cycloalkyl group, or a C3 to C4 cycloalkyl group. For example, the cycloalkyl group may be a cyclopropyl group, a cyclobutyl group, a cyclopentyl group, or a cyclohexyl group, but is not limited thereto.

As used herein, "aliphatic unsaturated organic group" refers to a hydrocarbon group in which at least one bond between two carbon atoms in the molecule is a double bond, a triple bond, or a combination thereof.

The aliphatic unsaturated organic group may be a C2 to C8 aliphatic unsaturated organic group. For example, the aliphatic unsaturated organic group may be a C2 to C7 aliphatic unsaturated organic group, a C2 to C6 aliphatic unsaturated organic group, a C2 to C5 aliphatic unsaturated organic group, or a C2 to C4 aliphatic unsaturated organic group. For example, the C2 to C4 aliphatic unsaturated organic group may be a vinyl group, an ethynyl group, an allyl group, a 1-propenyl group, a 1-methyl-1-propenyl group, a 2-propenyl group, a 2-methyl-2-propenyl group, a 1-propynyl group, a 1-methyl-1 propynyl group, a 2-propynyl group, a 2-methyl-2-propynyl group, a 1-butenyl group, a 2-butenyl group, a 3-butenyl group, a 1-butynyl group, a 2-butynyl group, or a 3-butynyl group.

As used herein, "aryl group" refers to a substituent in which all atoms in the cyclic substituent have a p-orbital and these p-orbitals are conjugated, and may include a monocyclic or a fused ring polycyclic (i.e., rings sharing adjacent pairs of carbon atoms) functional group.

As used herein, unless otherwise defined, "alkenyl group" refers to an aliphatic unsaturated alkenyl group including at least one double bond in a linear or branched aliphatic hydrocarbon group.

As used herein, unless otherwise defined, "alkynyl group" refers to an aliphatic unsaturated alkynyl group including at least one triple bond in a linear or branched aliphatic hydrocarbon group.

Hereinafter, a semiconductor photoresist composition according to one or more embodiments is described.

The semiconductor photoresist composition according to one or more embodiments of the present disclosure includes an organometallic compound represented by Chemical Formula 1, a photoacid generator (PAG), and a solvent.

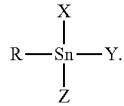

Chemical Formula 1

In Chemical Formula 1,

R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof, X, Y, and Z are each independently —OR$^1$ or —OC(=O)R$^2$, R$^1$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and R$^2$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The organometallic compound represented by Chemical Formula 1 has a structure in which a tin atom is substituted with one R group and three groups selected from the group consisting of —OR$^1$ and —OC(=O)R$^2$.

The compound represented by Chemical Formula 1 is an organotin compound, wherein tin may intensively absorb extreme ultraviolet (EUV) light at 13.5 nm and thus have excellent (or suitable) sensitivity to light having high energy, and R of Chemical Formula 1 may give photosensitivity to the compound represented by Chemical Formula 1 and in addition, may be bound to the tin and form a Sn—R bond and thus impart a solubility in an organic solvent to the organotin compound.

With regard to R of Chemical Formula 1, when the organic tin copolymer having structural units represented by Chemical Formula 1 and formed through copolymerization of the organometallic compounds is exposed to extreme ultraviolet light, the R functional group is dissociated from the Sn—R bond and forms a radical, and this radical forms an additional —Sn—O—Sn— bond and initiates a condensation polymerization reaction between organic tin copolymers and thus contributes to forming a semiconductor photoresist from the composition according to one or more embodiments.

In the organometallic compound represented by Chemical Formula 1, the substituent represented by R may be a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof.

The organometallic compound represented by Chemical Formula 1 further includes three organic ligands X, Y, and Z which are each hydrolyzed to form Sn—O bonds. The X, Y, and Z are heat treated under an acidic or basic catalyst, or hydrolyzed and dehydrated by a process other than heat treatment, to form Sn—O—Sn bonds between organotin compounds, whereby an organotin copolymer including the organometallic compound represented by Chemical Formula 1 is formed.

In addition, X, Y, and Z determine a solubility of the organometallic compound represented by Chemical Formula 1 in a solvent.

The semiconductor photoresist composition according to one or more embodiments of the present disclosure additionally includes a photoacid generator (PAG) in addition to the organometallic compound represented by Chemical Formula 1 and solvent. Because the semiconductor photoresist composition additionally includes the photoacid generator (PAG), the sensitivity and resolution characteristics may be improved simultaneously (or concurrently), and without the problem of deteriorating any one of the sensitivity and resolution characteristics of the semiconductor photoresist composition.

For example, after the organometallic copolymer formed by the copolymerization reaction between organometallic compounds represented by Chemical Formula 1 is applied on a substrate, EUV (extreme ultraviolet light) is irradiated onto the substrate, the photoacid generator is sensitized by the irradiated EUV (extreme ultraviolet light) to generate acid, the solubility of the organometallic copolymer is changed by the acid to be dissolved, and finally, development of the resin composition in the exposed portion becomes easier.

The photoacid generator (PAG) may include a cationic compound represented by Chemical Formula 2, Chemical Formula 3, or Chemical Formula 4.

Chemical Formula 2

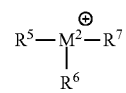

Chemical Formula 3

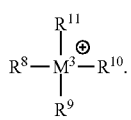

Chemical Formula 4

In Chemical Formula 2 to Chemical Formula 4,

M$^1$ is F, Cl, Br, or I,

M$^2$ is O, S, Se, or Te,

M$^3$ is N, P, As, or Sb, and

R$^3$ to R$^{11}$ are each independently a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, or a combination thereof.

In one or more embodiments, the photoacid generator (PAG) may include a cationic compound represented by Chemical Formula 5 or Chemical Formula 6.

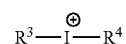

Chemical Formula 5

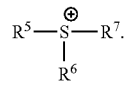

Chemical Formula 6

The organometallic compound represented by Chemical Formula 1 and the photoacid generator (PAG) may be included in a weight ratio of about 99:1 to about 60:40, for example, about 98:2, for example, about 95:5, for example, about 93:7, for example, about 90:10, for example, about 87:13, for example, about 85:15, for example, about 83:17, for example, about 80:20, for example, about 77:23, for example, about 75:25, for example, about 73:27, for example, about 70:30, for example, about 67:33, for example, about 65:35, for example, about 63:37, for example, about 60:40. When the photoacid generator (PAG) is included in the semiconductor photoresist composition in any of these weight ratio ranges, sensitivity and resolution characteristics may be simultaneously (or concurrently) improved without a problem of deteriorating any one of sensitivity and resolution characteristics.

The semiconductor photoresist composition according to one or more embodiments may further include an organometallic compound represented by Chemical Formula 7, an organometallic compound represented by Chemical Formula 8, or a combination thereof.

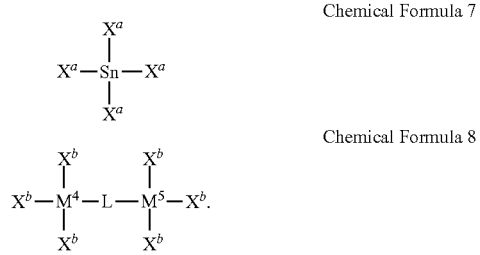

Chemical Formula 7

Chemical Formula 8

In Chemical Formula 7 and Chemical Formula 8, $X^a$ and $X^b$ are each independently —$OR^{12}$ or —OC(=O)$R^{13}$, $R^{12}$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $R^{13}$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $M^4$ and $M^5$ are each independently selected from the group consisting of tin (Sn), indium (In), and antimony (Sb), and L is a single bond, a substituted or unsubstituted divalent C1 to C20 saturated aliphatic hydrocarbon group, a substituted or unsubstituted divalent C3 to C20 saturated or unsaturated alicyclic hydrocarbon group, a substituted or unsubstituted divalent C2 to C20 unsaturated aliphatic hydrocarbon group including at least one double bond or triple bond, a substituted or unsubstituted divalent C6 to C20 aromatic hydrocarbon group, —O—, —C(=O)—, or a combination thereof.

The semiconductor photoresist composition according to one or more embodiments of the present disclosure includes the organometallic compound represented by Chemical Formula 7 and/or the organometallic compound represented by Chemical Formula 8, in addition to the organometallic compound represented by Chemical Formula 1 and the photoacid generator (PAG), simultaneously (or concurrently), and thus a semiconductor photoresist composition having excellent (e.g., improved) sensitivity and pattern formability may be provided.

By appropriately adjusting a ratio of the organometallic compound represented by Chemical Formula 7 and/or the organometallic compound represented by Chemical Formula 8 included in the organometallic copolymer, a degree of dissociation of the ligand represented by R from the copolymer may be controlled, and accordingly, a semiconductor photoresist having excellent (e.g., improved) sensitivity and low (e.g., reduced) line edge roughness and excellent (e.g., improved) resolution may be provided, while controlling a degree of cross-linking through oxo bonding with surrounding chains by radicals generated as the ligand is dissociated. For example, a semiconductor photoresist having excellent (e.g., improved) sensitivity, line edge roughness, and resolution may be provided by simultaneously (e.g., altogether) including the organometallic compound represented by Chemical Formula 1 and the organometallic compound represented by Chemical Formula 7 and/or the organometallic compound represented by Chemical Formula 8.

A weight ratio of the compound represented by Chemical Formula 7, the compound represented by Chemical Formula 8, or of a mixture thereof to the organometallic compound represented by Chemical Formula 1 may be about 1:1 to about 1:20, for example, about 1:1 to about 1:19, for example, about 1:1 to about 1:18, for example, about 1:1 to about 1:17, for example, about 1:1 to about 1:16, for example, about 1:1 to about 1:15, for example, about 1:1 to about 1:14, for example, about 1:1 to about 1:13, for example, about 1:1 to about 1:12, for example, about 1:1 to about 1:11, for example, about 1:1 to about 1:10, for example, about 1:1 to about 1:9, for example, about 1:1 to about 1:8, for example, about 1:1 to about 1:7, for example, about 1:1 to about 1:6, for example, about 1:1 to about 1:5, for example, about 1:1 to about 1:4, for example, about 1:1 to about 1:3, for example, about 1:1 to about 1:2, but the present disclosure is not limited thereto. When the weight ratio of the organometallic compound represented by Chemical Formula 1 to the compound represented by Chemical Formula 7, the organometallic compound represented by Chemical Formula 8, or a combination thereof satisfies any of the above ranges, a semiconductor photoresist composition having excellent (e.g., improved) sensitivity and resolution may be provided.

R may be, for example, a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethoxy group, a propoxy group, or a combination thereof, for example, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, a propoxy group, or a combination thereof.

$R^1$ may be a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, for example, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

$R^2$ may be hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof, for example, hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

The compound represented by Chemical Formula 1 may include a compound represented by Chemical Formula 9, a compound represented by Chemical Formula 10, a compound represented by Chemical Formula 11, a compound represented by Chemical Formula 12, or a combination thereof.

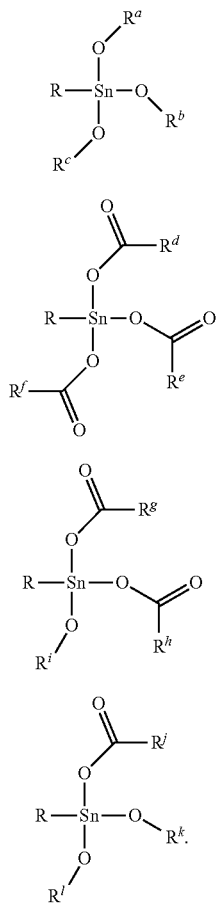

Chemical Formula 9

Chemical Formula 10

Chemical Formula 11

Chemical Formula 12

In Chemical Formula 9, Chemical Formula 10, Chemical Formula 11, and Chemical Formula 12, $R^a$, $R^b$, $R^c$, $R^i$, $R^k$, and $R^l$ are each independently the same as the definition for $R^1$, and $R^d$, $R^e$, $R^f$, $R^g$, $R^h$, and $R^j$ are each independently the same as the definition for $R^2$.

The solvent included in the semiconductor photoresist composition according to one or more embodiments may be an organic solvent. The solvent may be, for example, selected from the group consisting of aromatic compounds (e.g., xylene, toluene, etc.), alcohols (e.g., 4-methyl-2-pentanol, 4-methyl-2-propanol, 1-butanol, methanol, isopropyl alcohol, 1-propanol, propylene glycol monomethyl ether), ethers (e.g., anisole, tetrahydrofuran), esters (n-butyl acetate, propylene glycol monomethyl ether acetate, ethyl acetate, ethyl lactate), ketones (e.g., methyl ethyl ketone, 2-heptanone), and mixtures thereof, but is not limited thereto.

In one or more embodiments, the semiconductor photoresist composition may further include a resin, in addition to the aforementioned organometallic compound and solvent.

The resin may be a phenol-based resin including at least one or more aromatic moieties of Group 1.

Group 1

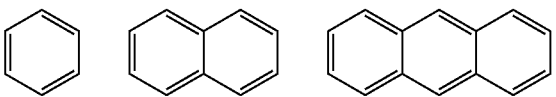
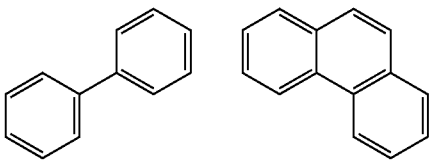
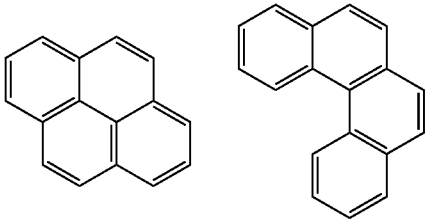
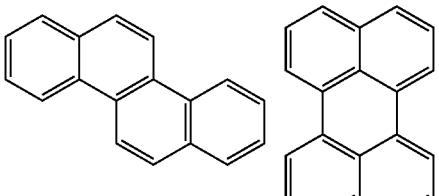
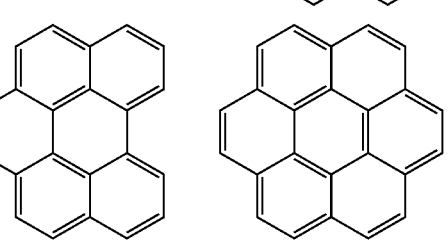
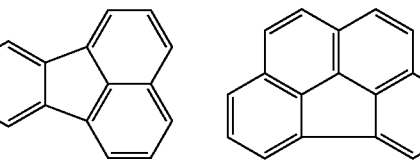
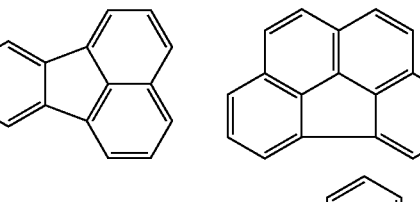
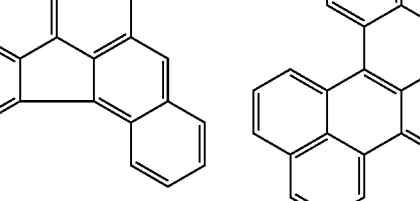
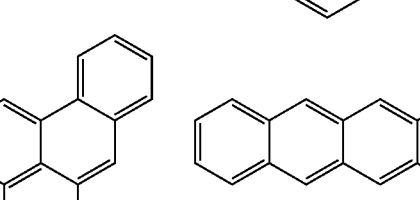

-continued

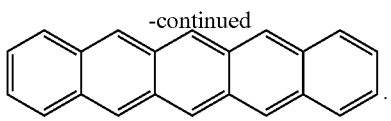

The resin may have a weight average molecular weight of about 500 to about 20,000.

The resin may be included in an amount of about 0.1 wt % to about 50 wt % based on a total amount of the semiconductor photoresist composition.

When the resin is included within the amount range, it may have excellent (e.g., improved) etch resistance and heat resistance.

In one or more embodiments, the semiconductor photoresist composition may be composed of the organometallic compound, a solvent, and a resin. However, the semiconductor photoresist composition according to the above embodiment may further include an additive as needed. Examples of the additive may include a surfactant, a cross-linking agent, a leveling agent, organic acid, a quencher, or a combination thereof.

The surfactant may include, for example, an alkyl benzene sulfonate salt, an alkyl pyridinium salt, polyethylene glycol, a quaternary ammonium salt, or a combination thereof, but is not limited thereto.

The cross-linking agent may be, for example, a melamine-based cross-linking agent, a substituted urea-based cross-linking agent, an acryl-based cross-linking agent, an epoxy-based cross-linking agent, or a polymer-based cross-linking agent, but is not limited thereto. It may be a cross-linking agent having at least two cross-linking forming substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trimethylpropane triglycidyl ether, 1,3-bis(glycidoxypropyl)tetramethyldisiloxane, methoxymethylated urea, butoxymethylated urea, and/or methoxymethylated thiourea, and/or the like.

The leveling agent may be utilized for improving coating flatness during printing and may be any suitable leveling agent.

The organic acid may include p-toluenesulfonic acid, benzenesulfonic acid, p-dodecylbenzenesulfonic acid, 1,4-naphthalenedisulfonic acid, methanesulfonic acid, a fluorinated sulfonium salt, malonic acid, citric acid, propionic acid, methacrylic acid, oxalic acid, lactic acid, glycolic acid, succinic acid, or a combination thereof, but is not limited thereto.

The quencher may be tri-p-tolylamine, methyl diphenyl amine, triphenyl amine, phenylenediamine, naphthylamine, diaminonaphthalene, or a combination thereof.

An amount (e.g., a utilized amount) of the additives may be controlled depending on desired properties.

In one or more embodiments, the semiconductor photoresist composition may further include a silane coupling agent as an adherence enhancer in order to improve a close-contacting force with the substrate (e.g., in order to improve adherence of the semiconductor photoresist composition to the substrate). The silane coupling agent may be, for example, a silane compound including a carbon-carbon unsaturated bond such as vinyltrimethoxysilane, vinyltriethoxysilane, vinyl trichlorosilane, vinyltris(β-methoxyethoxy)silane; and/or 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; and/or trimethoxy[3-(phenylamino)propyl]silane, and/or the like, but is not limited thereto.

The semiconductor photoresist composition may be formed into a pattern having a high aspect ratio without a collapse. Accordingly, in order to form a fine pattern having a width of, for example, about 5 nm to about 100 nm, about 5 nm to about 80 nm, about 5 nm to about 70 nm, about 5 nm to about 50 nm, about 5 nm to about 40 nm, about 5 nm to about 30 nm, or about 5 nm to about 20 nm, the semiconductor photoresist composition may be utilized for a photoresist process utilizing light in a wavelength ranging from about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to one or more embodiments may be utilized to realize extreme ultraviolet lithography utilizing an EUV light source of a wavelength of about 13.5 nm.

According to one or more embodiments, a method of forming patterns utilizing the aforementioned semiconductor photoresist composition is provided. For example, the manufactured pattern may be a photoresist pattern.

The method of forming patterns according to one or more embodiments includes forming an etching-objective layer on a substrate, coating the semiconductor photoresist composition on the etching-objective layer to form a photoresist layer, patterning the photoresist layer to form a photoresist pattern, and etching the etching-objective layer utilizing the photoresist pattern as an etching mask.

Hereinafter, a method of forming patterns utilizing the semiconductor photoresist composition is described referring to FIGS. 1 to 5. FIGS. 1 to 5 are cross-sectional views for explaining a method of forming patterns utilizing a semiconductor photoresist composition according to one or more embodiments.

Referring to FIG. 1, an object for etching is prepared. The object for etching may be a thin film 102 formed on a semiconductor substrate 100. Hereinafter, the object for etching is described as being the thin film 102. An entire surface of the thin film 102 is washed to remove impurities and/or the like remaining thereon. The thin film 102 may be for example a silicon nitride layer, a polysilicon layer, and/or a silicon oxide layer.

Subsequently, the resist underlayer composition for forming a resist underlayer 104 is spin-coated on the surface of the washed thin film 102. However, the embodiment is not limited thereto, and any of the various suitable coating methods, for example a spray coating, a dip coating, a knife edge coating, a printing method, for example an inkjet printing and/or a screen printing, and/or the like may be utilized.

The coating process of the resist underlayer may be omitted Hereinafter, a process including a coating of the resist underlayer is described.

Then, the coated composition is dried and baked to form a resist underlayer 104 on the thin film 102. The baking may be performed at about 100° C. to about 500° C., for example, about 100° C. to about 300° C.

The resist underlayer 104 is formed between the substrate 100 and a photoresist layer 106 and thus may prevent (or reduce) non-uniformity and pattern-forming capability of a photoresist line width when a ray reflected from the interface between the substrate 100 and the photoresist layer 106, or a hardmask between layers, is scattered into an unintended photoresist region.

Figure 2:
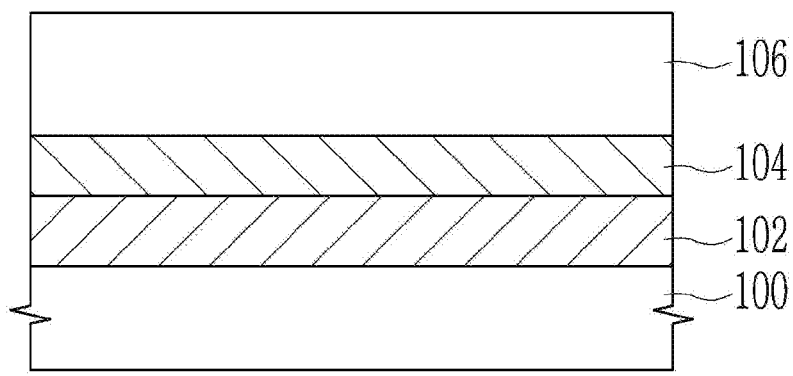

Referring to FIG. 2, the photoresist layer 106 is formed by coating the semiconductor photoresist composition on the resist underlayer 104. The photoresist layer 106 is obtained by coating the aforementioned semiconductor photoresist composition on the thin film 102 formed on the substrate 100 and then, curing it through a heat treatment.

In one or more embodiments, the formation of a pattern by utilizing the semiconductor photoresist composition may include coating the semiconductor photoresist composition on the substrate 100 having the thin film 102 through spin coating, slit coating, inkjet printing, and/or the like and then, drying it to form the photoresist layer 106.

The semiconductor photoresist composition may be the same as described herein, and a duplicative description thereof will not be provided again.

Subsequently, a substrate 100 having the photoresist layer 106 is subjected to a first baking process. The first baking process may be performed at about 80° C. to about 120° C.

Figure 3:
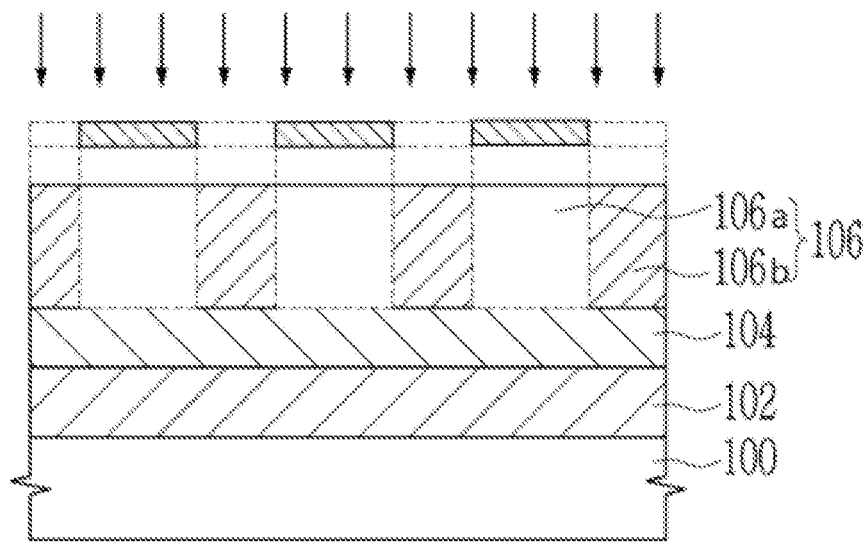

Referring to FIG. 3, the photoresist layer 106 may be selectively exposed.

For example, the exposure may utilize an activation radiation with light having a high energy wavelength such as EUV (extreme ultraviolet; a wavelength of about 13.5 nm), an E-Beam (an electron beam), and/or the like, as well as a short (e.g., shorter than the visible spectrum) wavelength such as an i-line (a wavelength of about 365 nm), a KrF excimer laser (a wavelength of about 248 nm), an ArF excimer laser (a wavelength of about 193 nm), and/or the like.

For example, light for the exposure according to one or more embodiments may have a short (e.g., shorter than the visible spectrum) wavelength, and a high energy wavelength ranging from about 5 nm to about 150 nm, for example, EUV (Extreme UltraViolet; a wavelength of about 13.5 nm), an E-Beam (an electron beam), and/or the like.

The exposed region 106b of the photoresist layer 106 has a different solubility from the non-exposed region 106a of the photoresist layer 106 due to forming a polymer by a cross-linking reaction such as condensation between organometallic compounds.

Subsequently, the substrate 100 is subjected to a second baking process. The second baking process may be performed at a temperature of about 90° C. to about 200° C. The exposed region 106b of the photoresist layer 106 becomes easily (e.g., substantially) indissoluble (e.g., insoluble) regarding a developing solution due to the second baking process.

Figure 4:
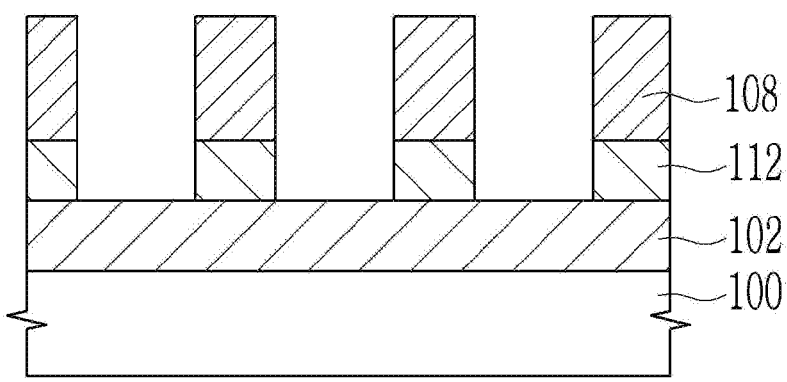

In FIG. 4, the non-exposed region 106a of the photoresist layer is dissolved and removed utilizing the developing solution to form a photoresist pattern 108. For example, the non-exposed region of the photoresist layer is dissolved and removed by utilizing an organic solvent such as 2-heptanone and/or the like to complete the photoresist pattern 108 corresponding to the negative tone image.

As described above, a developing solution utilized in a method of forming patterns according to one or more embodiments may be an organic solvent. The organic solvent utilized in the method of forming patterns according to one or more embodiments may be, for example, selected from the group consisting of ketones such as methylethylketone, acetone, cyclohexanone, 2-heptanone, and/or the like; alcohols such as 4-methyl-2-propanol, 1-butanol, isopropanol, 1-propanol, methanol, and/or the like; esters such as propylene glycol monomethyl ether acetate, ethyl acetate, ethyl lactate, n-butyl acetate, butyrolactone, and/or the like; aromatic compounds such as benzene, xylene, toluene, and/or the like, and combinations thereof.

However, the photoresist pattern according to one or more embodiments is not necessarily limited to the negative tone image but may be formed to have a positive tone image. Herein, a developing agent utilized for forming the positive tone image may be a quaternary ammonium hydroxide composition such as tetraethylammonium hydroxide, tetrapropylammonium hydroxide, tetrabutylammonium hydroxide, or a combination thereof.

As described above, exposure to light having a high energy such as EUV (Extreme UltraViolet; a wavelength of about 13.5 nm), an E-Beam (an electron beam), and/or the like, as well as light having a wavelength such as i-line (wavelength of about 365 nm), KrF excimer laser (wavelength of about 248 nm), ArF excimer laser (wavelength of about 193 nm), and/or the like, may provide a photoresist pattern 108 having a width (e.g., a thickness) of about 5 nm to about 100 nm. For example, the photoresist pattern 108 may have a width of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, or about 10 nm to about 20 nm.

In one or more embodiments, the photoresist pattern 108 may have a half-pitch of less than or equal to about 50 nm, for example less than or equal to about 40 nm, less than or equal to about 30 nm, or less than or equal to about 25 nm, and a line edge roughness of less than or equal to about 10 nm, or less than or equal to about 5 nm.

Subsequently, the photoresist pattern 108 is utilized as an etching mask to etch the resist underlayer 104. Through this etching process, an organic layer pattern 112 is formed. The organic layer pattern 112 also may have a width corresponding to that of the photoresist pattern 108.

Figure 5:
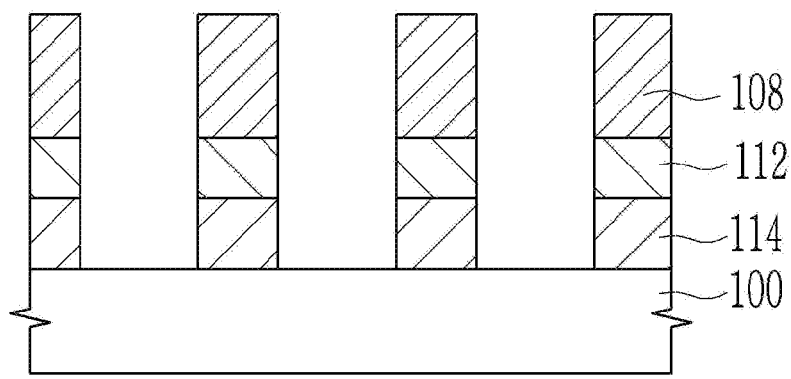

Referring to FIG. 5, the photoresist pattern 108 is applied as an etching mask to etch the exposed thin film 102. As a result, the thin film is formed with a thin film pattern 114.

The etching of the thin film 102 may be, for example, dry etching utilizing an etching gas, and the etching gas may be for example $CHF_3$, $CF_4$, $Cl_2$, $BCl_3$ and/or a mixed gas thereof.

In the exposure process, the thin film pattern 114 formed by utilizing the photoresist pattern 108 formed through the exposure process performed by utilizing an EUV light source may have a width corresponding to that of the photoresist pattern 108. For example, the thin film pattern 114 may have a width of about 5 nm to about 100 nm, which may be the same as that of the photoresist pattern 108. For example, the thin film pattern 114 formed by utilizing the photoresist pattern 108 formed through the exposure process performed by utilizing an EUV light source may have a width of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, and/or about 10 nm to about 20 nm, or for example, less than or equal to about 20 nm, like that of the photoresist pattern 108.

Hereinafter, the present disclosure will be described in more detail through examples of the preparation of the aforementioned semiconductor photoresist composition. However, the present disclosure is technically not restricted by the following examples.

EXAMPLES

Synthesis Example 1

20 g (51.9 mmol) of Ph₃SnCl was dissolved in 70 ml of THF in a 250 mL 2-necked and round-bottomed flask and then, cooled down to 0° C. in an ice bath. Subsequently, a 1 M butyl magnesium chloride (BuMgCl) THF solution (62.3 mmol) was slowly add thereto in a dropwise fashion. When the addition in a dropwise fashion was complete, the obtained mixture was stirred at 25° C. for 12 hours to obtain a compound represented by Chemical Formula 13 at a yield of 85%.

Chemical Formula 13

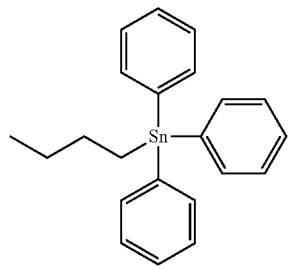

Synthesis Example 2

A compound represented by Chemical Formula 14 at a yield of 88% was obtained according to substantially the same method as Synthesis Example 1 except that a 2 M isopropyl magnesium chloride (iPrMgCl) THF solution (62.3 mmol) was utilized instead of the 1 M butyl magnesium chloride (BuMgCl) THF solution utilized in Synthesis Example 1.

Chemical Formula 14

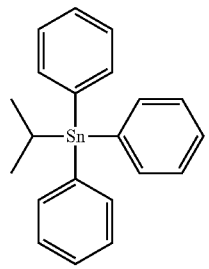

Synthesis Example 3

A compound represented by Chemical Formula 15 at a yield of 76% was obtained according to substantially the same method as Synthesis Example 1 except that a 1 M neopentyl magnesium chloride THF solution (62.3 mmol) was utilized instead of the 1 M butyl magnesium chloride (BuMgCl) THF solution utilized in Synthesis Example 1.

Chemical Formula 15

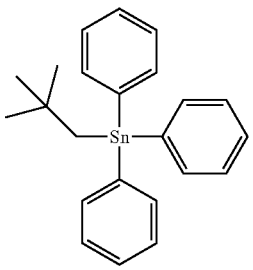

Synthesis Example 4

The compound represented by Chemical Formula 13 prepared according to Synthesis Example 1 (10 g, 24.6 mmol) was dissolved in 50 mL of CH₂Cl₂, and 3 equivalent (73.7 mmol) of a 2 M HCl diethyl ether solution was slowly added thereto in a dropwise fashion at −78° C. for 30 minutes. Subsequently, the obtained mixture was stirred at 25° C. for 12 hours, and then, a compound represented by Chemical Formula 16 was obtained at a yield of 80% by concentrating the solvent and performing vacuum distillation.

Chemical Formula 16

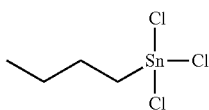

Synthesis Example 5

A compound represented by Chemical Formula 17 was obtained at a yield of 75% according to substantially the same method as Synthesis Example 4 except that the compound represented by Chemical Formula 14 according to Synthesis Example 2 was utilized instead of the compound represented by Chemical Formula 13 according to Synthesis Example 1.

Chemical Formula 17

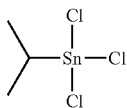

Synthesis Example 6

A compound represented by Chemical Formula 18 was obtained at a yield of 70% according to substantially the same method as Synthesis Example 4 except that the compound represented by Chemical Formula 15 according to Synthesis Example 3 was utilized instead of the compound represented by Chemical Formula 13 according to Synthesis Example 1.

Chemical Formula 18

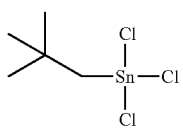

Synthesis Example 7

25 mL of acetic acid was slowly added in a dropwise fashion to 10 g (25.6 mmol) of the compound represented by Chemical Formula 16 according to Synthesis Example 4 at 25° C. and then, heated and refluxed for 12 hours. The temperature was decreased to 25° C., and then, the acetic acid was vacuum distilled to obtain a compound represented by Chemical Formula 19 at a yield of 90%.

Chemical Formula 19

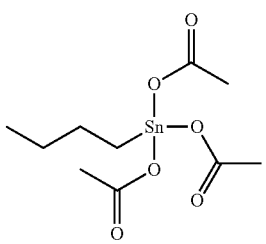

Synthesis Example 8

25 mL of acrylic acid was slowly added in a dropwise fashion to 10 g (25.4 mmol) of the compound represented by Chemical Formula 17 according to Synthesis Example 5 at 25° C. and then, heated and refluxed at 80° C. for 6 hours. The temperature was decreased to 25° C., and then, the acrylic acid was vacuum distilled to obtain a compound represented by Chemical Formula 20 at a yield of 50%.

Chemical Formula 20

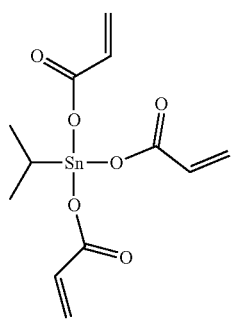

Synthesis Example 9

25 mL of propionic acid was slowly added in a dropwise fashion to 10 g (23.7 mmol) of the compound represented by Chemical Formula 18 according to Synthesis Example 6 at 25° C. and then, heated and refluxed at 110° C. for 12 hours. The temperature was decreased to 25° C., and then, the propionic acid was vacuum distilled to obtain a compound represented by Chemical Formula 21 at a yield of 40%.

Chemical Formula 21

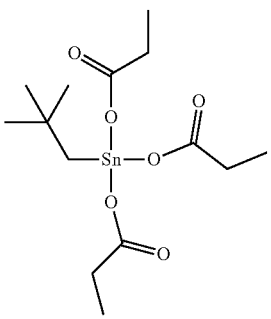

Synthesis Example 10

30 mL of anhydrous pentane was added to 10 g (35.4 mmol) of the compound represented by Chemical Formula 16 according to Synthesis Example 4 and then, cooled down to 0° C. 7.8 g (106.3 mmol) of diethylamine was slowly added thereto in a dropwise fashion, and subsequently 7.9 g (106.3 mmol) of tert-butanol was added thereto and then, stirred at 25° C. for 1 hour. When a reaction was complete, the resultant was filtered, concentrated, and vacuum-dried to obtain a compound represented by Chemical Formula 22 at a yield of 60%.

Chemical Formula 22

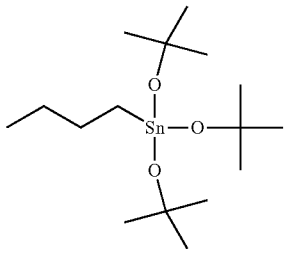

Synthesis Example 11

30 mL of anhydrous pentane was added to 10 g (37.3 mmol) of the compound represented by Chemical Formula 17 according to Synthesis Example 5 and then, cooled down to 0° C. 8.2 g (111.9 mmol) of diethylamine was slowly added thereto in a dropwise fashion, and subsequently, 6.7 g (111.9 mmol) of isopropanol was added thereto and then, stirred at 25° C. for 1 hour. When a reaction was complete, the resultant was filtered, concentrated, and vacuum-dried to obtain a compound represented by Chemical Formula 23 at a yield of 60%.

Chemical Formula 23

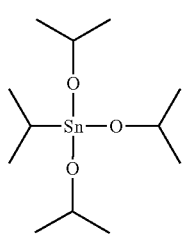

Synthesis Example 12

30 mL of anhydrous pentane was added to 10 g (18.7 mmol) of the compound represented by Chemical Formula 18 according to Synthesis Example 6 and then, cooled down to 0° C. 7.4 g (101.3 mmol) of diethylamine was slowly added thereto in a dropwise fashion, and subsequently, 6.1 g (101.3 mmol) of ethanol was added thereto and then, stirred at 25° C. for 1 hour. When a reaction was complete, the resultant was filtered, concentrated, and vacuum-dried to obtain a compound represented by Chemical Formula 24 at a yield of 60%.

Chemical Formula 24

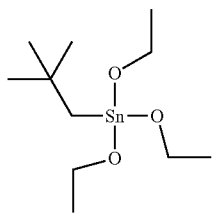

Synthesis Example 13

10 g (25.4 mmol) of the compound represented by Chemical Formula 14 was put in a 100 mL round-bottomed flask, and 25 ml of formic acid was slowly added thereto in a dropwise fashion at 25° C. and then, heated and refluxed at 100° C. for 24 hours.

Subsequently, the temperature was decreased to 25° C., and then, the formic acid was vacuum distilled to obtain a compound represented by Chemical Formula 25 at a yield of 90%.

Chemical Formula 25

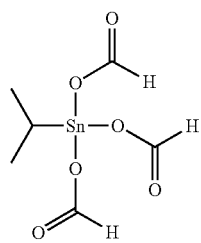

Examples 1 to 48

Each of the compounds represented by Chemical Formulas 19 to 25 obtained in Synthesis Examples 7 to 13, respectively, PAG-1 (San Apro, iodonium) or PAG-2 (Sigma-Aldrich, sulfonium), and lactic acid (Sigma-Aldrich) were dissolved in 4-methyl-2-pentanol, each at concentration of 3 wt % in the weight ratio shown in Tables 1 to 4, and were filtered with a 0.1 μm PTFE (polytetrafluoroethylene) syringe filter to prepare each of semiconductor photoresist compositions according to Examples 1 to 48.

A disk-shaped silicon wafer having a native-oxide surface and a 4 inch diameter was utilized as a substrate for thin film coating and treated in a UV ozone cleaning system for 10 minutes before coating the compositions. On the treated substrate, the semiconductor photoresist compositions according to Examples 1 to 48 were respectively spin-coated at 1500 rpm for 30 seconds and then, baked (baked after being applied, PAB (post-apply bake)) at 100° C. for 120 seconds to form a photoresist thin film.

After the coating and the baking, the thicknesses of the films were measured through ellipsometry, and were calculated to be about 25 nm.

TABLE 1

| | | Example 1 | Example 2 | Example 3 | Example 4 | Example 5 | Example 6 | Example 7 | Example 8 |
|---|---|---|---|---|---|---|---|---|---|
| Organic metallic compound | Chemical Formula19 | 99 | | | | | | | |
| | Chemical Formula20 | | 99 | | | | | | |
| | Chemical Formula21 | | | 99 | | | | | 98 |
| | Chemical Formula22 | | | | 99 | | | | |
| | Chemical Formula23 | | | | | 99 | | | |
| | Chemical Formula24 | | | | | | 99 | | |
| | Chemical Formula25 | | | | | | | 99 | |
| PAG-1 | | 1 | 1 | 1 | 1 | 1 | 1 | 1 | 1 |
| Organic acid | | | | | | | | | 1 |

(unit: parts by weight)

TABLE 2

| | | Example 9 | Example 10 | Example 11 | Example 12 | Example 13 | Example 14 | Example 15 | Example 16 |
|---|---|---|---|---|---|---|---|---|---|
| Organic metallic compound | Chemical Formula19 | 95 | | | | | | | |
| | Chemical Formula20 | | 95 | | | | | | |
| | Chemical Formula21 | | | 95 | | | | | 94 |
| | Chemical Formula22 | | | | 95 | | | | |
| | Chemical Formula23 | | | | | 95 | | | |
| | Chemical Formula24 | | | | | | 95 | | |
| | Chemical Formula25 | | | | | | | 95 | |
| PAG-1 | | 5 | 5 | 5 | 5 | 5 | 5 | 5 | 5 |
| Organic acid | | | | | | | | | 1 |

(unit: parts by weight)

TABLE 3

| | | Example 17 | Example 18 | Example 19 | Example 20 | Example 21 | Example 22 | Example 23 | Example 24 |
|---|---|---|---|---|---|---|---|---|---|
| Organic metallic compound | Chemical Formula19 | 90 | | | | | | | |
| | Chemical Formula20 | | 90 | | | | | | |
| | Chemical Formula21 | | | 90 | | | | | 89 |
| | Chemical Formula22 | | | | 90 | | | | |
| | Chemical Formula23 | | | | | 90 | | | |
| | Chemical Formula24 | | | | | | 90 | | |
| | Chemical Formula25 | | | | | | | 90 | |
| PAG-1 | | 10 | 10 | 10 | 10 | 10 | 10 | 10 | 10 |
| Organic acid | | | | | | | | | 1 |

(unit: parts by weight)

TABLE 4

| | | Example 25 | Example 26 | Example 27 | Example 28 | Example 29 | Example 30 | Example 31 | Example 32 |
|---|---|---|---|---|---|---|---|---|---|
| Organic metallic compound | Chemical Formula19 | 85 | | | | | | | |
| | Chemical Formula20 | | 85 | | | | | | |
| | Chemical Formula21 | | | 85 | | | | | 84 |
| | Chemical Formula22 | | | | 85 | | | | |
| | Chemical Formula23 | | | | | 85 | | | |
| | Chemical Formula24 | | | | | | 85 | | |
| | Chemical Formula25 | | | | | | | 85 | |
| PAG-1 | | 15 | 15 | 15 | 15 | 15 | 15 | 15 | 15 |
| Organic acid | | | | | | | | | 1 |

(unit: parts by weight)

TABLE 5

| | | Example 33 | Example 34 | Example 35 | Example 36 | Example 37 | Example 38 | Example 39 | Example 40 |
|---|---|---|---|---|---|---|---|---|---|
| Organic metallic compound | Chemical Formula19 | 99 | | | 95 | | 90 | | |
| | Chemical Formula20 | | 99 | | | 95 | | 90 | |
| | Chemical Formula21 | | | 99 | | | 95 | | |
| | Chemical Formula22 | | | | | | | | |
| | Chemical Formula23 | | | | | | | | |
| | Chemical Formula24 | | | | | | | | |
| | Chemical Formula25 | | | | | | | | |
| PAG-2 | | 1 | 1 | 1 | 5 | 5 | 5 | 10 | 10 |
| Organic acid | | | | | | | | | |

(unit: parts by weight)

TABLE 6

| | | Example 41 | Example 42 | Example 43 | Example 44 | Example 45 | Example 46 | Example 47 | Example 48 |
|---|---|---|---|---|---|---|---|---|---|
| Organic metallic compound | Chemical Formula19 | | 85 | | | | | | |
| | Chemical Formula20 | | | 85 | | | | | |
| | Chemical Formula21 | 90 | | | 85 | 98 | 94 | 89 | 84 |
| | Chemical Formula22 | | | | | | | | |
| | Chemical Formula23 | | | | | | | | |
| | Chemical Formula24 | | | | | | | | |
| | Chemical Formula25 | | | | | | | | |
| PAG-2 | | 10 | 15 | 15 | 15 | 1 | 5 | 10 | 15 |
| Organic acid | | | | | | 1 | 1 | 1 | 1 |

(unit: parts by weight)

Comparative Example 1

The compound represented by Chemical Formula 19 obtained in Synthesis Example 7 was dissolved in 4-methyl-2-pentanol at a concentration of 3 wt %, and was filtered with a 0.1 μm PTFE (polytetrafluoroethylene) syringe filter to prepare a semiconductor photoresist composition according to Comparative Example 1.

In substantially the same manner as in Example 1, a photoresist thin film including the semiconductor photoresist composition according to Comparative Example 1 was prepared. After the coating and baking, the thickness of the film was about 25 nm.

Comparative Example 2

A semiconductor photoresist composition according to Comparative Example 2 and a photoresist thin film including the same were manufactured according to substantially the same method as Comparative Example 1, except that nBuSnOOH (TCI Inc.) was utilized instead of the compound represented by Chemical Formula 19. After the coating and baking, the thickness of the film was about 25 nm.

Evaluation

The films according to Example 1 to Example 48, Comparative Example 1 and Comparative Example 2 (each formed on a disk-shaped silicon wafer utilizing the coating method) were exposed to extreme ultraviolet (EUV) light to form 12 to 100 nm line/space patterns by varying energy and a focus. After the exposure, the films were each baked at 180° C. for 120 seconds, subsequently, dipped in a Petri dish containing 2-heptanone for 60 seconds and taken out thereof, and washed with the same solvent for 10 seconds. Finally, the films were baked at 150° C. for 5 minutes, and then, pattern images thereof were obtained through SEM (scanning electron microscopy). From the SEM images, the highest resolution, optimal energy, and line edge roughness (LER) are provided Tables 7 and 8.

TABLE 7

| | Resolution (nm) | Energy (mJ/cm$^2$) | LER (nm) |
|---|---|---|---|
| Example 1 | 11 | 65 | 1.7 |
| Example 2 | 11 | 64 | 1.8 |
| Example 3 | 10 | 65 | 1.6 |
| Example 4 | 12 | 69 | 1.9 |
| Example 5 | 12 | 68 | 1.9 |
| Example 6 | 12 | 67 | 1.9 |
| Example 7 | 11 | 65 | 1.7 |
| Example 8 | 10 | 63 | 1.6 |
| Example 9 | 11 | 52 | 1.6 |
| Example 10 | 11 | 51 | 1.7 |
| Example 11 | 10 | 52 | 1.5 |

TABLE 7-continued

| | Resolution (nm) | Energy (mJ/cm$^2$) | LER (nm) |
|---|---|---|---|
| Example 12 | 12 | 55 | 1.8 |
| Example 13 | 12 | 54 | 1.8 |
| Example 14 | 12 | 54 | 1.8 |
| Example 15 | 11 | 52 | 1.6 |
| Example 16 | 10 | 50 | 1.5 |
| Example 17 | 11 | 42 | 1.6 |
| Example 18 | 11 | 41 | 1.7 |
| Example 19 | 10 | 42 | 1.5 |
| Example 20 | 12 | 44 | 1.8 |
| Example 21 | 12 | 44 | 1.8 |
| Example 22 | 12 | 43 | 1.8 |
| Example 23 | 11 | 42 | 1.6 |
| Example 24 | 10 | 40 | 1.5 |
| Example 25 | 11 | 37 | 1.8 |
| Example 26 | 11 | 37 | 1.9 |
| Example 27 | 10 | 37 | 1.7 |
| Example 28 | 12 | 40 | 2.0 |
| Example 29 | 12 | 39 | 2.0 |
| Example 30 | 12 | 39 | 2.0 |
| Example 31 | 11 | 37 | 1.8 |
| Example 32 | 10 | 36 | 1.7 |

TABLE 8

| | Resolution (nm) | Energy (mJ/cm$^2$) | LER (nm) |
|---|---|---|---|
| Example 33 | 11 | 65 | 1.7 |
| Example 34 | 11 | 64 | 1.8 |
| Example 35 | 10 | 65 | 1.6 |
| Example 36 | 11 | 52 | 1.6 |
| Example 37 | 11 | 51 | 1.7 |
| Example 38 | 10 | 52 | 1.5 |
| Example 39 | 11 | 42 | 1.6 |
| Example 40 | 11 | 41 | 1.7 |
| Example 41 | 10 | 42 | 1.5 |
| Example 42 | 11 | 37 | 1.8 |
| Example 43 | 11 | 37 | 1.9 |
| Example 44 | 10 | 37 | 1.7 |
| Example 45 | 10 | 63 | 1.6 |
| Example 46 | 10 | 50 | 1.5 |
| Example 47 | 10 | 40 | 1.5 |
| Example 48 | 10 | 36 | 1.7 |
| Comparative Example 1 | 14 | 78 | 2.6 |
| Comparative Example 2 | 18 | 102 | 4.1 |

Referring to Tables 7 and 8, the photoresist thin films utilizing the semiconductor photoresist compositions according to Examples 1 to 48 exhibited excellent resolution, sensitivity, and line edge roughness (LER).

In contrast, photoresist thin films formed of the semiconductor photoresist composition of Comparative Example 1 that does not include the photoacid generator and includes the compound represented by Chemical Formula 19 alone, and the semiconductor photoresist composition of Comparative Example 2 that does not include the photoacid generator and includes nBuSnOOH (TCI Inc.), both exhibited higher resolution, optimal energy, and line edge roughness (LER) than those of Examples. Accordingly, the resolution, sensitivity, and line edge roughness (LER) thereof were not good compared with the Examples.

Hereinbefore, the certain embodiments of the present disclosure have been described and illustrated, however, it should be apparent to a person with ordinary skill in the art that the present disclosure is not limited to the embodiments as described, and may be variously modified and transformed without departing from the spirit and scope of the present disclosure. Accordingly, the modified or transformed embodiments as such may not be understood separately from the technical ideas and aspects of the present disclosure, and the modified embodiments are within the scope of the claims (and equivalents of the claims) of the present disclosure.

| Description of symbols | |
|---|---|
| 100: substrate | 102: thin film |
| 104: resist underlayer | 106: photoresist layer |
| 106b: exposed region | 106a: non-exposed region |
| 108: photoresist pattern | 112: organic layer pattern |
| 114: thin film pattern | |

What is claimed is:

1. A semiconductor photoresist composition comprising:
an organometallic compound represented by Chemical Formula 1,
an organometallic compound represented by Chemical Formula 7, an organometallic compound represented by Chemical Formula 8, or a combination thereof,
a photoacid generator (PAG),
an organic acid, and
a solvent,
wherein a weight ratio of the organometallic compound represented by Chemical Formula 7, the organometallic compound represented by Chemical Formula 8, or the sum of the compound represented by Chemical Formula 7 and the compound represented by Chemical Formula 8, to the organometallic compound represented by Chemical Formula 1 is about 1:1 to about 1:20:

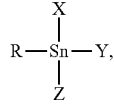

Chemical Formula 1 wherein, in Chemical Formula 1,
R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof,
X, Y, and Z are each independently —OC(=O)R$^2$, and
R$^2$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof;

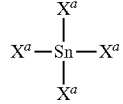

Chemical Formula 7

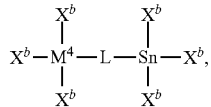

Chemical Formula 8 wherein, in Chemical Formula 7 and Chemical Formula 8,
$X^a$ and $X^b$ are each independently —OR$^{12}$ or —OC(=O)R$^3$, $R^{12}$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $R^{13}$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, $M^4$ and $M^5$ are each independently selected from the group consisting of tin (Sn), indium (In), and antimony (Sb), and L is a single bond, a substituted or unsubstituted divalent C1 to C20 saturated aliphatic hydrocarbon group, a substituted or unsubstituted divalent C3 to C20 saturated or unsaturated alicyclic hydrocarbon group, a substituted or unsubstituted divalent C2 to C20 unsaturated aliphatic hydrocarbon group including at least one double bond or triple bond, a substituted or unsubstituted divalent C6 to C20 aromatic hydrocarbon group, —O—, —C(=O)—, or a combination thereof.

2. The semiconductor photoresist composition of claim 1, wherein the photoacid generator (PAG) comprises a cationic compound represented by Chemical Formula 2, Chemical Formula 3, or Chemical Formula 4:

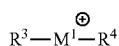

Chemical Formula 2

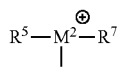

Chemical Formula 3

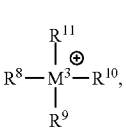

Chemical Formula 4 wherein, in Chemical Formula 2 to Chemical Formula 4,
$M^1$ is F, Cl, Br, or I,
$M^2$ is O, S, Se, or Te,
$M^3$ is N, P, As, or Sb, and
$R^3$ to $R^{11}$ are each independently a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, or a combination thereof.

3. The semiconductor photoresist composition of claim 1, wherein the photoacid generator (PAG) comprises a cationic compound represented by Chemical Formula 5 or Chemical Formula 6:

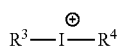

Chemical Formula 5

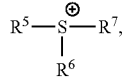

Chemical Formula 6 and wherein, in Chemical Formula 5 and Chemical Formula 6, $R^3$ to $R^7$ are each independently a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, or a combination thereof.

4. The semiconductor photoresist composition of claim 1, wherein the organometallic compound represented by Chemical Formula 1 and the photoacid generator (PAG) are in a weight ratio of about 99:1 to about 60:40.

5. The semiconductor photoresist composition of claim 1, wherein the organometallic compound represented by Chemical Formula 1 and the photoacid generator (PAG) are in a weight ratio of about 95:5 to about 85:15.

6. The semiconductor photoresist composition of claim 1, wherein

R is a substituted or unsubstituted C1 to C8 alkyl group, a substituted or unsubstituted C3 to C8 cycloalkyl group, a substituted or unsubstituted C2 to C8 aliphatic unsaturated organic group including at least one double bond or triple bond, a substituted or unsubstituted C6 to C20 aryl group, an ethoxy group, a propoxy group, or a combination thereof, $R^2$ is hydrogen, a substituted or unsubstituted C1 to C8 alkyl group, a substituted or unsubstituted C3 to C8 cycloalkyl group, a substituted or unsubstituted C2 to C8 alkenyl group, a substituted or unsubstituted C2 to C8 alkynyl group, a substituted or unsubstituted C6 to C20 aryl group, or a combination thereof.

7. The semiconductor photoresist composition of claim 1, wherein

R is a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, an ethoxy group, a propoxy group, or a combination thereof, and $R^2$ is hydrogen, a methyl group, an ethyl group, a propyl group, a butyl group, an isopropyl group, a tert-butyl group, a 2,2-dimethylpropyl group, a cyclopropyl group, a cyclobutyl group, a cyclopentyl group, a cyclohexyl group, an ethenyl group, a propenyl group, a butenyl group, an ethynyl group, a propynyl group, a butynyl group, a phenyl group, a tolyl group, a xylene group, a benzyl group, or a combination thereof.

8. The semiconductor photoresist composition of claim 1, wherein the organometallic compound represented by Chemical Formula 1 comprises a compound represented by Chemical Formula 10:

Chemical Formula 10

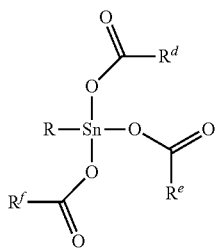

wherein, in Chemical Formula 10,

R is a substituted or unsubstituted C1 to C20 alkyl group, a substituted or unsubstituted C3 to C20 cycloalkyl group, a substituted or unsubstituted C2 to C20 aliphatic unsaturated organic group including at least one double bond or triple bond, a substituted or unsubstituted C6 to C30 aryl group, an ethoxy group, a propoxy group, or a combination thereof, and $R^d$, $R^e$, and $R^f$ are each independently hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

9. The semiconductor photoresist composition of claim 1, wherein the semiconductor photoresist composition further comprises an additive selected from the group consisting of a surfactant, a cross-linking agent, a leveling agent, a quencher, and combinations thereof.

10. A method of forming patterns, the method comprising:
    forming an etching-objective layer on a substrate,
    coating the semiconductor photoresist composition of claim 1 on the etching-objective layer to form a photoresist layer,
    patterning the photoresist layer to form a photoresist pattern, and
    etching the etching-objective layer utilizing the photoresist pattern as an etching mask.

11. The method of claim 10, wherein the photoresist pattern is formed utilizing light in a wavelength of about 5 nm to about 150 nm.

12. The method of claim 10, further comprising providing a resist underlayer between the substrate and the photoresist layer.

13. The method of claim 10, wherein the photoresist pattern has a width of about 5 nm to about 100 nm.

* * * * *

UNITED STATES PATENT AND TRADEMARK OFFICE
CERTIFICATE OF CORRECTION

| | | |
|---|---|---|
| PATENT NO. | : 12,158,699 B2 | Page 1 of 2 |
| APPLICATION NO. | : 17/217941 | |
| DATED | : December 3, 2024 | |
| INVENTOR(S) | : Changsoo Woo et al. | |

It is certified that error appears in the above-identified patent and that said Letters Patent is hereby corrected as shown below:

In the Claims

In Column 30, Lines 61-66, in Claim 1, delete " 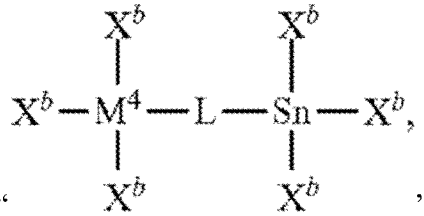 " and insert

-- 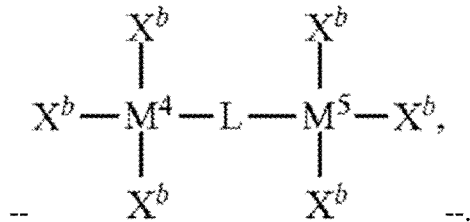 --.

In Column 31, Line 1, in Claim 1, before "wherein," insert -- and --.

In Column 31, Lines 2-3, in Claim 1, delete "—OC(=O)R$^3$," and insert -- —OC(=O)R$^{13}$, --.

In Column 31, Line 47, in Claim 2, before "wherein," insert -- and --.

In Column 32, Line 35, in Claim 6, after "thereof," insert -- and --.

Signed and Sealed this
Eighth Day of April, 2025

Coke Morgan Stewart
*Acting Director of the United States Patent and Trademark Office*

In Column 33, Lines 2-11, in Claim 8, after " 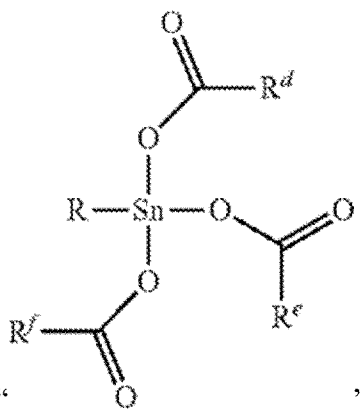 " insert -- , --.
In Column 33, Line 14, in Claim 8, before "wherein," insert -- and --.